United States Patent
Miura et al.

[19]

[11] Patent Number: 5,867,810
[45] Date of Patent: Feb. 2, 1999

[54] WIRING DEVICE AND WIRING METHOD

[75] Inventors: Hiroshi Miura; Yasuhiro Yamashita; Kazuyuki Iida; Ryoji Yamada; Yumiko Katsuyama, all of Kawasaki, Japan

[73] Assignee: Fujitsu Limited, Kawasaki, Japan

[21] Appl. No.: 739,751

[22] Filed: Oct. 29, 1996

[30] Foreign Application Priority Data

May 31, 1996 [JP] Japan .................................. 8-138361

[51] Int. Cl.⁶ ........................................ G06F 19/00
[52] U.S. Cl. .......................... 702/191; 364/488; 364/491
[58] Field of Search .................... 364/488, 489, 364/490, 491, 578, 574; 257/210, 211; 361/679, 748, 760, 777, 764, 778; 702/191

[56] References Cited

U.S. PATENT DOCUMENTS

| | | | |
|---|---|---|---|
| 5,247,455 | 9/1993 | Yoshikawa | 364/490 |
| 5,249,134 | 9/1993 | Oka | 364/491 |
| 5,282,146 | 1/1994 | Aihara et al. | 364/488 |
| 5,446,674 | 8/1995 | Ikeda et al. | 364/489 |
| 5,618,744 | 4/1997 | Suzuki et al. | 364/490 |
| 5,642,286 | 6/1997 | Yamada et al. | 364/491 |
| 5,657,242 | 8/1997 | Sekiyama et al. | 364/491 |

FOREIGN PATENT DOCUMENTS

7306886 A  11/1995  Japan .

*Primary Examiner*—John Barlow
*Assistant Examiner*—Bryan Bui
*Attorney, Agent, or Firm*—Armstrong, Westerman, Hattori, McLeland & Naughton

[57] ABSTRACT

A wiring device and wiring method suitable for designing LSIs or printed boards or the like. The wiring device includes a wiring pattern editing unit for editing wiring patterns; a noise analyzing unit for analyzing a noise occurring when a circuit is operated according to the wiring patterns edited by the wiring editing unit; and a noise occurring spot specifying unit for specifying a spot when noise occurs in the wiring pattern, based on the solution analyzed by the noise analyzing unit and the wiring pattern edited in the wiring pattern editing unit The man-hours of an operator can be reduced by interlocking the crosstalk noise analysis with the wiring pattern editing function and then by reducing the number of man-hours needed to correct a wiring pattern by an operator.

12 Claims, 10 Drawing Sheets

WIRING DEVICE AND WIRING METHOD

BACKGROUND OF THE INVENTION

1) Field of the Invention

The present invention relates to a wiring device and wiring method suitable for designing LSIs (Large Scale Integrated Circuits) or printed boards.

2) Description of the Related Art

Recently, it has been required to assemble and arrange densely components on semiconductor large scale integrated circuits (LSIs), multichip modules (MCMs), printed boards and the like and then to wire the components with a small number of signal layers in short time. Generally, various circuits above described are designed using CAD (Computer Aided Design).

For example, in order to deal with various wiring problems in printed wiring boards each with plural part pins, a CAD device edits wiring patterns and then decides a wiring rule on wiring boards.

Various circuits have been required to form in higher density and higher performance. The circuit characteristics are largely affected by crosstalk noise occurred due to plural lines forming wiring patterns which are closely arranged.

Hence in order to edit wiring patterns for semiconductor LSIs, multichip modules (MCM), printed wiring boards or the like using the CAD device, it is necessary to design circuits with circuit characteristics immune to noise components by taking account of the crosstalk noise.

In general CAD devices, a wiring pattern editing system that edits wiring patterns as well as a transmission path analytic simulator that analyzes a crosstalk noise occurring when a circuit including wiring patterns edited by the wiring pattern editing system is in an active state are arranged independently and cannot perform their jobs concurrently.

That is, when an operator edits a wiring pattern using the wiring pattern editing system, the wiring pattern editing system is closed once. Then crosstalk noise occurring when a circuit is operated by activating the transmission path analytic simulator are analyzed.

When it is found that the crosstalk noise affect significantly the circuit characteristics, the above-mentioned transmission path analytic simulator is closed. Then the wiring pattern editing system is reactivated to specify and correct a spot causing crosstalk noise on a wiring pattern.

In concrete, when an operator corrects an edited wiring pattern, by considering the crosstalk noise, the analytical solution of the transmission path analytic simulator, for example, is printed. The spot causing crosstalk noise on the wiring pattern is specified and corrected by contracting the wiring pattern displayed on the screen of the wiring pattern editing system reactivated with the analytical solution by the operator himself.

In the CAD system, since the wiring pattern editing system and the transmission path analytic simulator are independently arranged, they cannot be activated at the same time. Hence there is the problem of needing much effort to correct the wiring pattern while referring to the solution from the transmission path analytic simulator.

Particularly, when the analytical solution of the transmission path analytic simulator is displayed as a graph showing a crosstalk noise on an edited wiring pattern, it is impossible to specify the crosstalk noise causing spot on the wiring pattern by referring to only the graph. Hence, in some cases, the noise causing spot cannot be specified principally even when the graph is contrasted with the wiring pattern displayed on the screen of the wiring pattern editing system reactivated.

In that case, the noise causing spot must be specified and corrected by presuming a noise causing spot using the analytical solution of the transmission path analytic simulator and repeating the noise causing spot presumed on the wiring pattern in the wiring pattern editing system. This procedure forces the operator to do too much work.

On the other hand, the system that can deal with various wiring problems and can edit automatically wiring patterns is under development as a wiring pattern editing system.

However, even when such an automatic wiring pattern editing system is adopted to the above-mentioned CAD system, the wiring pattern must be manually corrected based on the analytical solution of the transmission path analytic simulator.

Hence, there is the problem of being hindered from improving the automatic wiring application rate.

SUMMARY OF THE INVENTION

The present invention is made to overcome the above mentioned problems. An object of the present invention is to provide a wiring device that can reduce the man-hours of an operator by interlocking the crosstalk noise analysis with the wiring pattern editing function and then by reducing the number of man-hours needed to correct wiring patterns by an operator.

Another object of the present invention is to provide a wiring method that can reduce the man-hours of an operator by interlocking the crosstalk noise analysis with the wiring pattern editing function and then by reducing the number of man-hours needed to correct wiring patterns by an operator.

In order to achieve the above objects, according to the present invention, the wiring device is characterized by a wiring pattern editing unit for editing a wiring pattern; a noise analyzing unit for analyzing noise occurring when a circuit is in an active state according to the wiring pattern edited by the wiring editing unit; and a noise occurring spot specifying unit for specifying a spot where noise occurs in the wiring pattern, based on an solution analyzed by the noise analyzing unit and the wiring pattern edited in the wiring pattern editing unit.

According to the present invention, the wiring method which edits a wiring pattern is characterized by the steps of analyzing a noise occurred when a circuit is operated according to the wiring pattern edited; linking an analytical solution obtained in the step and the edited wiring pattern; and displaying and specifying a noise occurring spot in the wiring pattern.

According to the present invention, the noise occurring spot specifying unit can specify (displays) a noise occurring spot in a wiring pattern by interlocking a crosstalk noise analysis and a wiring pattern automatic editing function, based on the analytical solution of the noise analyzing unit and a wiring pattern edited in the wiring pattern editing unit. Hence, the present invention has the advantage of clarifying the crosstalk producing spot by an operator, reducing the number of man-hours for pattern correction, and contributing to system automation.

DESCRIPTION OF THE PREFERRED EMBODIMENTS (a) Explanation of an Aspect of the Present Invention Let us explain an embodiment of the present invention with reference to the attached drawings.

Figure 1:
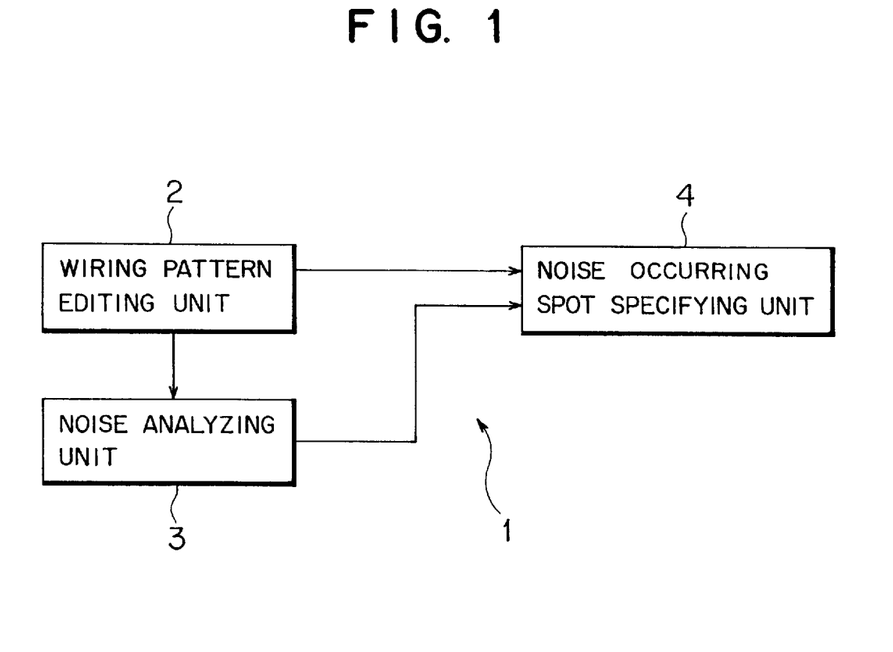
FIG. 1 is a block diagram showing an aspect present invention.

FIG. 1 is a block diagram showing an aspect of the present invention. Referring to FIG. 1, numeral 1 represents a wiring device. The wiring device 1 includes a wiring pattern editing unit 2 and a noise analyzing unit 3, and a noise occurring spot specifying unit 4.

The wiring pattern editing unit 2 edits wiring patterns.

The noise analyzing unit 3 analyzes a noise occurring when a circuit is operated based on a wiring pattern edited by the wiring pattern editing unit 2. The noise occurring spot specifying unit 4 specifies the noise occurring spot on a wiring pattern based on the analytical solution of the noise analyzing unit 3 and the wiring pattern edited by the wiring pattern editing unit 2.

The noise occurring spot specifying unit 4 links the analytical solution from the noise analyzing unit 3 with the wiring pattern edited in the wiring pattern unit 2. The noise occurring spot specifying unit is formed of a noise occurring spot displaying unit that displays the spot as noise occurring spot specifying information. The wiring pattern editing unit 2 can include a wiring pattern correcting unit that corrects wiring patterns by moving and deleting wiring pattern forming lines, based on noise occurring spot specifying information displayed on the noise occurring spot displaying unit.

In this case, the wiring pattern correcting unit can be formed to correct wiring patterns by moving and deleting designated lines.

The wiring pattern correcting unit also includes a move regulated area setting unit that sets move regulated regions to be regulated as move destinations of lines to inhibit lines from moving to an area set by a move regulated area setting unit at the time of correcting a wiring pattern. The wiring pattern correcting unit can include a move regulated area displaying unit that displays an area set by the move regulated area setting unit.

The wiring device 1 shown in FIG. 1 edits wiring patterns, analyzes noise occurring when a circuit is operated according to an edited wiring pattern, links the analytical solution with the edited wiring pattern, and finally displays and specifies the spot where noise occurs in the wiring pattern.

The crosstalk noise which occurs due to plural closely-arranged lines forming wiring patterns can be analyzed as the above-mentioned noise.

A wiring pattern is corrected by moving and deleting lines forming a wiring pattern, based on noise spot specifying information displayed. The lines can be regulated from moving toward the area where noise occurred in an active state of the circuit exceeds a predetermined value.

In this case, the area where lines are regulated from moving can be displayed together with noise occurring spot specifying information.

Hence, according to the present invention, the noise occurring spot specifying unit can specify (display) a noise occurring spot in a wiring pattern, by interlocking the crosstalk noise analyzing function with the automatic wiring pattern editing function, based on an analytical solution of the noise analyzing unit and a wiring pattern edited by the wiring pattern editing unit. Hence, since an operator can clearly specify the crosstalk noise occurring spot, the man-hours for the pattern correction can be reduced. This feature contributes advantageously to automating the system.

Further, the move regulated area setting unit is arranged according to the present invention. When a wiring pattern is corrected, the wiring pattern correcting unit can inhibit a line from moving toward an area set by the move regulated area setting unit. A wiring pattern can be automatically corrected easily and at high speed via no operator by considering the crosstalk noise at a line move destination in correcting a wiring pattern while the crosstalk noise in the wiring pattern is maintained at a value lower than a value before correction.

According to the present invention, the move regulated area displaying unit can display an area set by the move regulated area setting unit. Particularly, when a wiring pattern is corrected according to an operator's indication while having a sense of the move regulated area. It is prevented that the operator indicates wrongly to move a line to the move regulated area. Therefore there is the advantage of greatly reducing the time of a wiring design by aiming at the work efficiency.

(b) Explanation of an Embodiment of the Present Invention:

The embodiment of the present invention will be described below by referring to the attached drawings.

Figure 2:
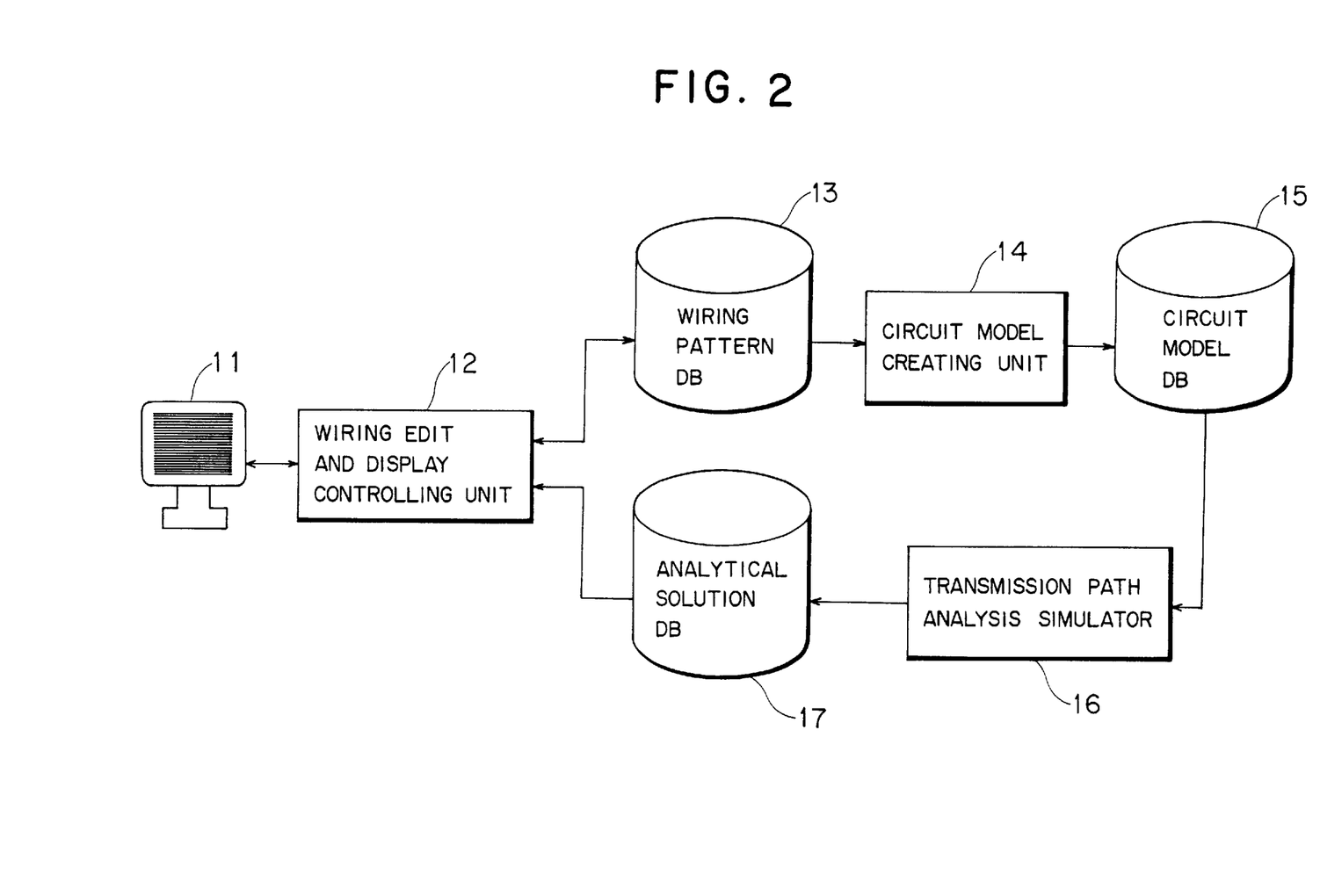
FIG. 2 is a block diagram showing a CAD device acting as a wiring device according to an embodiment of a present embodiment.

FIG. 2 is a block diagram showing a CAD (Computed Aided Design) device acting as a wiring device according to an embodiment of the present invention. Referring to FIG. 2, the CAD device 10 consists of a display 11, a wiring edit and display controlling unit 12, a wiring pattern database (wiring pattern DB) 13, a circuit model creating unit 14, a circuit model database (circuit model DB) 15, a transmission path analytic simulator 16 and an analytical solution database (analytical solution DB) 17.

The wiring edit and display controlling unit 12 controls display wiring patterns edited as solutions to various wiring problems to be displayed on the display 11 and then performs an editing process of a wiring pattern displayed on the display 11 including move and deletion of a wiring pattern and the like. The wiring editing and display controlling unit 12 has the function as a wiring pattern editing unit of editing wiring patterns.

The wiring pattern database (wiring pattern DB) 13 holds display information edited by the wiring edit and display controlling unit 12 (or dot information forming a wiring pattern on the screen of the display 11) in the form of, for example, a two-dimensional coordinate.

Further, the circuit model creating unit 14 recognizes circuit characteristics by detecting circuit constitute elements according to the display information on the wiring pattern DB 13 and then creates the equivalent circuit having the same one as the circuit characteristic as the circuit model. The created circuit model is held in the circuit model database (circuit model DB) 15.

The transmission path analytic simulator 16 functions as a noise analyzing unit that receives information regarding the equivalent circuit of a wiring pattern from the circuit model DB 15 and then analyzes crosstalk noise occurring on a transmission path (wiring path) when a circuit is operated according to the wiring pattern edited by the wiring edit and display controlling unit 12.

The transmission path analyzing simulator 16 extracts part of wiring patterns edited by the wiring editing and display controlling unit 12 and then analyses the crosstalk noise by paying attention to only the part of the wiring patterns.

Figure 4:
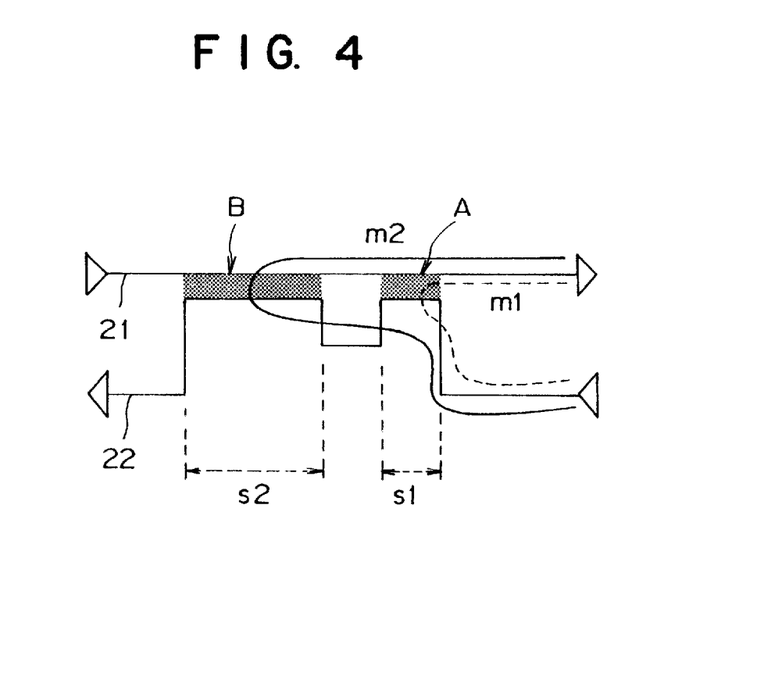
FIG. 4 is a diagram used for explaining the cause of a crosstalk noise produced in the present embodiment.

The crosstalk noise is a phenomenon in which the signal on a line leaks to another line by closely arranged plural lines (transmission lines) forming a wiring pattern. For example, as shown in FIG. 4, the networks (lines) 21 and 22 forming a wiring pattern are closely arranged in parallel in the regions A and B. The network 22 provides a crosstalk noise to the network 22, or the vice versa.

Figure 6:
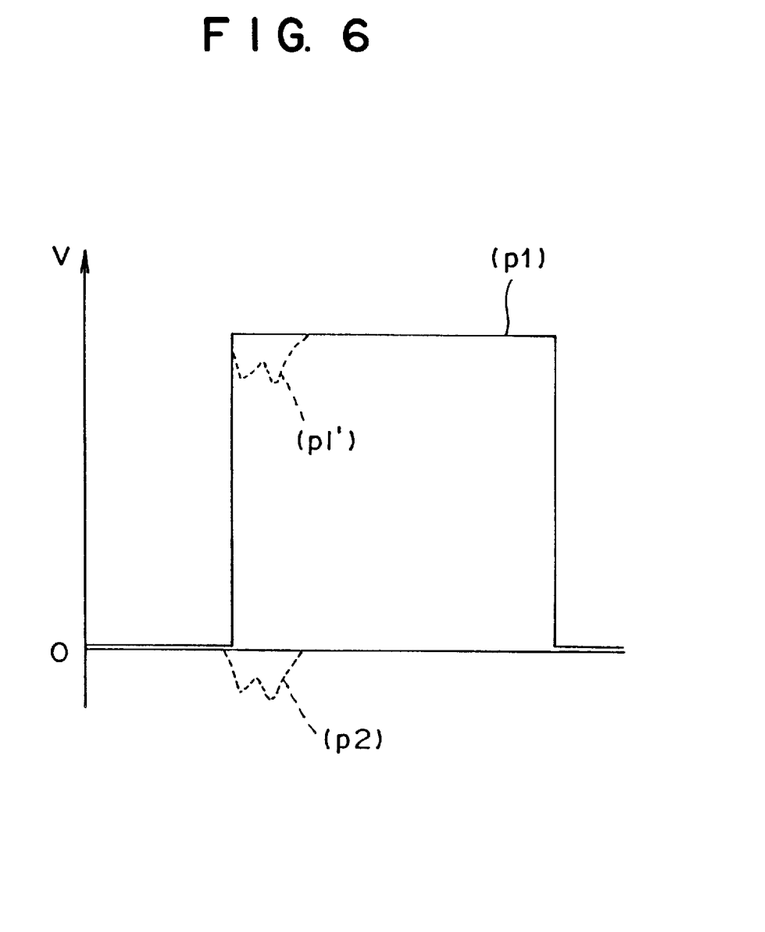
FIG. 6 is a diagram showing an example of occurrence of a crosstalk noise, in the present embodiment.

When the pulse signal (p1) shown in FIG. 6 is transmitted in the network 21 shown in FIG. 4, the crosstalk noise (p2) is superposed on the pulse signal (p1), in response to crosstalk noise (p2) from the network 22. As a result, the pulse signal (p1) is deteriorated (see dotted lines (p1') shown in FIG. 6).

The amplitude (noise peak) of the crosstalk noise is expressed the function of the space between the lines and the function of the length of lines closely arranged in parallel. The path m1 where a noise propagates in the region A is proportional to the period of time t1 taken from the reference time to the noise peaks in the analytical solution shown in FIG. 5. The path m2 where a noise propagates in the region B is proportional to the period of time t2 taken from the reference time to the noise peaks in the analytical solution shown in FIG. 5.

Figure 5:
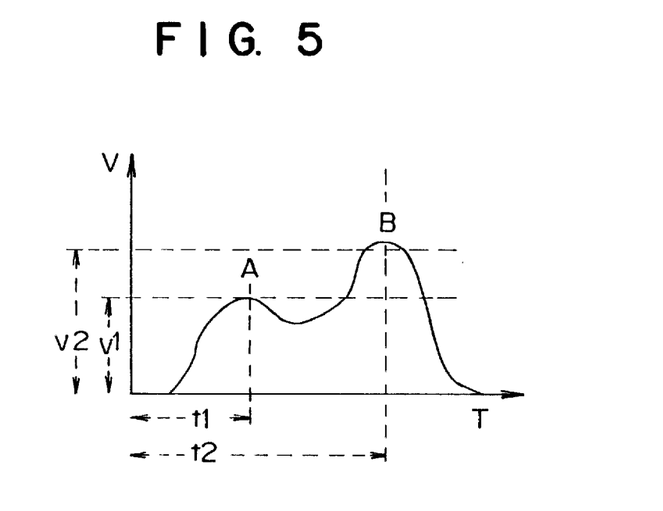
FIG. 5 is a diagram showing an analytical solution of the transmission path analytic simulator in a CAD device according to present embodiment.

In this case, as the space between the networks 21 and 22 is narrowed, the noise peaks (the voltage value on the vertical line) shown in FIG. 5 become large. As the length s1 of the networks 21 and 22 in parallel in the region A is longer while the length s2 of the networks 21 and 22 in parallel in the region B is longer, the noise peaks become large.

That is, as shown in FIG. 5, the space between the networks 21 and 22 in the region A and the space between the networks 21 and 22 in the region B are nearly the same.

However, the length s1 of the networks 21 and 22 arranged in parallel in the region A is shorter than the length s2 of the networks 21 and 22 arranged in parallel in the region B. The ratio between the noise peak in the region B and the noise peak of the noise peak in the region A is v1/v2.

The analytical solution database (analytical solution DB) 17 shown in FIG. 2 holds analytical solutions regarding crosstalk noise from the transmission path analytic simulator 16 as display information (dot information corresponding to x and y coordinates) for displaying a graph showing the crosstalk noise on the display 11.

The wiring edit and display controlling unit 12 controls the wiring pattern edited as a solution to various wiring problems to be displayed on the display 11. The wiring edit and display controlling unit 12 also receives display information from the analytical solution DB and then plots graphs such as line graphs and bar graphs on the display 11 by contracting the analytical solution regarding the crosstalk noise from the transmission path analytic simulator 16 with the above-mentioned wiring pattern.

That is, the wiring edit and display controlling unit 12 clarifies and specifies the corresponding relationship of the amount of the crosstalk noise occurring at a position on a wiring pattern by contracting the wiring pattern from the wiring pattern DB 13 with the analytic solution of the crosstalk noise from the analytical solution DB 17, thus displaying it on the display 11.

In other words, the wiring pattern as well as the analytical solution regarding the wiring pattern crosstalk noise are displayed mutually and correspondingly on the display 11.

In such a way, the crosstalk noise occurring on the wiring pattern can be recognized principally.

In concrete, the spots causing crosstalk noise are indicated with A and B on the display 11, together with the wiring pattern shown in FIG. 4. The analytical solutions corresponding to the spots A and B are indicated and displayed as noise peaks A and B with the same symbols A and B as shown in FIG. 5. An operator can easily contract the noise causing spot by simultaneously displaying the wiring pattern and the analytical solution on the same screen of the display.

Figure 7:
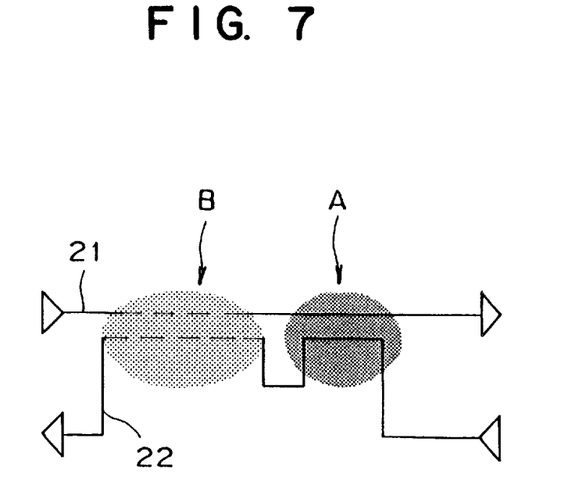
FIG. 7 is an explanatory diagram showing a spot causing occurrence of a crosstalk noise and a display corresponding to the size, in the present embodiment.

The visibility of an operator can be improved by displaying crosstalk noise causing spots A and B on the wiring pattern and the amount of the occurred crosstalk noise surrounded with an ellipse on the display 11, as shown in FIG. 7.

In other words, the display 11 links the analytical solution from the transmission path analytic simulator 16 with the wiring pattern edited by the wiring edit and display controlling unit 12 and then displays the outcome as information on a specified noise causing spot.

Hence, the combination of the display 11 and the wiring edit and display controlling unit 12 functions as a noise causing spot specifying unit that specifies a noise occurring spot on a wiring pattern based on the analytical solution of the transmission path simulator 16 and the wiring pattern edited by the wiring edit and display controlling unit 12.

Figure 3:
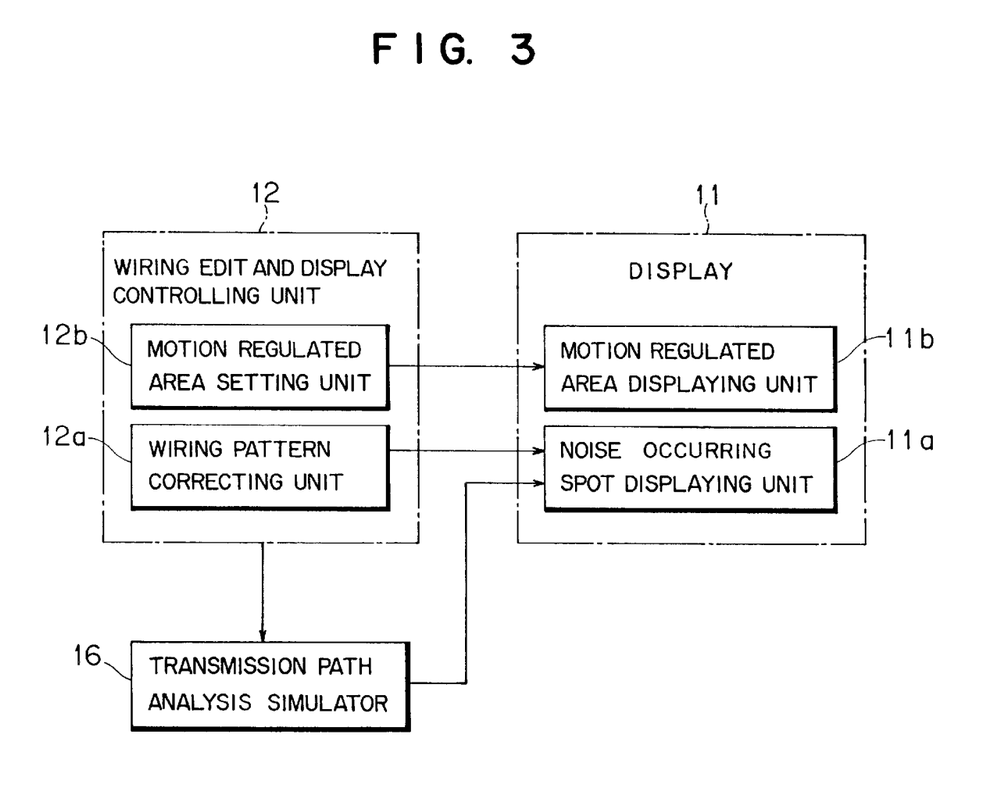
FIG. 3 is a functional block diagram showing the main portion of the CAD device of the present embodiment.

FIG. 3 is a functional block diagram showing a CAD device according to the present embodiment. In the CAD device shown in FIG. 3, the wiring pattern DB 13, the circuit model creating unit 14, the circuit model DB 15 and the analytical solution DB 17, shown in FIG. 2, are omitted.

As shown in FIG. 3, the wiring edit and display controlling unit 12 functionally consists of a wiring pattern correcting unit 12a and a move regulated area setting unit 12b.

The wiring pattern correcting unit 12a corrects automatically the wiring pattern by moving and deleting lines forming a wiring pattern based on noise spot specifying information displayed on the display 11.

The wiring pattern correcting unit 12a corrects automatically a spot corresponding to a noise peak exceeding a predetermined threshold, based on the analytical solution from the transmission path analytic simulator 16. The wiring pattern correcting unit 12a performs the wiring pattern correction according to the operator's indication.

Figure 8:
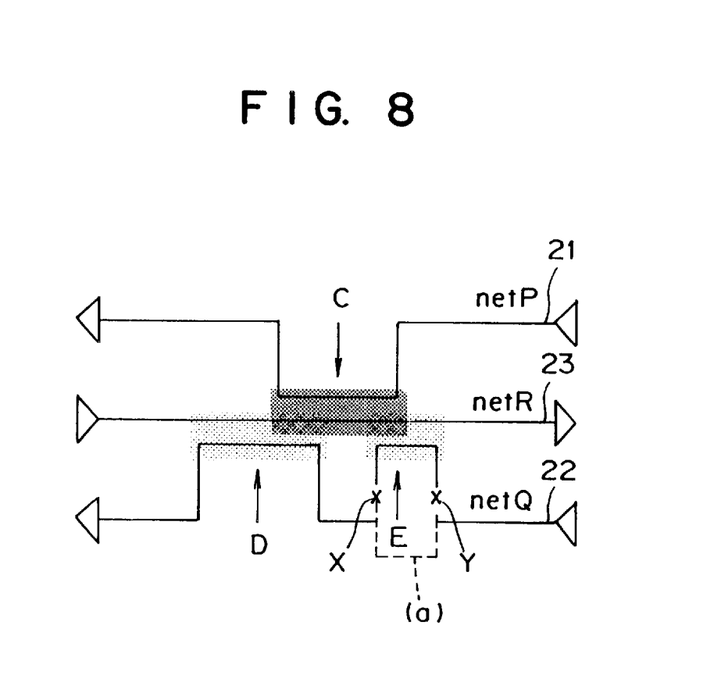
FIG. 8 is a diagram used for explaining the cause of producing a crosstalk noise, according to the present embodiment.

As shown in FIG. 8, when two or more networks (e.g. including two networks 21 and 22) provide a crosstalk noise to the network 23, an operator designates selectively the network 21 or 22 as a network to be corrected by the wiring pattern correcting unit 12a. In this operation, the wiring pattern correcting unit 12a can automatically correct the wiring pattern by moving or deleting the designated network (line).

In this case, the spot where a crosstalk noise occurs from the network 21 to the network 23 is the region C while the spots where a crosstalk noise occurs from the network 22 to the network 23 is the regions D and E. The crosstalk noise to the network 23 is one (refer to FIG. 9(q3)) obtained by combining the crosstalk noise (refer to FIG. 9(q1)) from the network 21 with the crosstalk noise (refer to FIG. 9(q2)) from the network 22. The noise peak exceeds a predetermined threshold (refer to FIG. 9(q4)).

Figure 9:
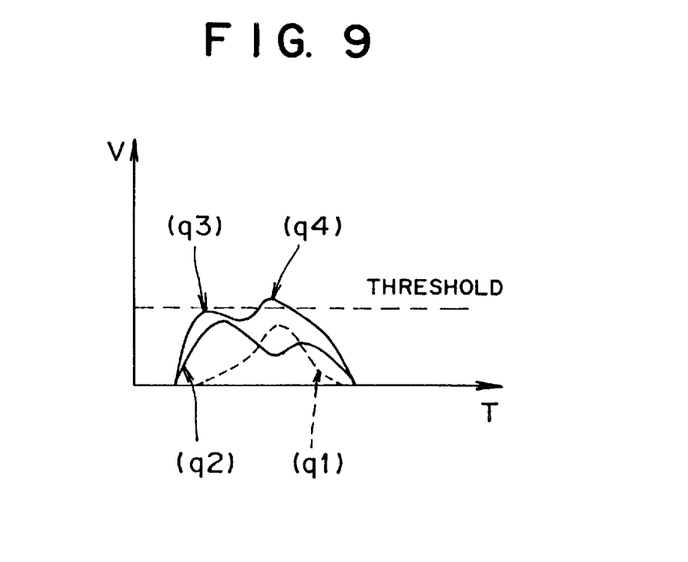
FIG. 9 is a diagram showing an analytical solution of a transmission path analytic simulator of a CAD device according to the present embodiment.

Like the cases shown in FIGS. 4 and 5, since the display 11 displays the analytical solution shown in FIG. 9 linked with the noise occurring spots on the wiring pattern shown in FIG. 8, an operator can designate and correct (rewire) the network with the largest crosstalk noise occurring causes exceeding a predetermined threshold among the networks 21 and 22. The crosstalk noise which occur as the analytical solution can be effectively suppressed.

For example, the noise peak (refer to FIG. 9(q4)) exceeding the threshold shown in FIG. 5 is caused by the crosstalk noise from the network 21 in the region C and by the crosstalk noise from the network 22 in the region E.

In contrast, when an operator designates the network 22 and moves the line XY in the region E causing the crosstalk noise as shown with dot lines (a) in FIG. 8, the crosstalk noise to which the network 23 is subjected can be suppressed to less than a predetermined threshold.

The move regulated area setting unit 12b shown in FIG. 3 sets a move regulated area (wiring inhibited region) regulating as the destination of a line to be moved. When the wiring pattern correcting unit 12a corrects a wiring pattern, the move regulated area setting unit 12b inhibits a line from moving a move regulated area set by the move regulated area setting unit 12b.

That is, the wiring pattern correcting unit 12a is formed in such a manner that lines are not moved to the area set by the move regulated area setting unit 12b in correcting a wiring pattern.

When the wiring pattern correcting unit 12a moves a wiring pattern, the crosstalk noise may occur at the destination to be moved. However, the crosstalk noise can be avoided since the move regulated area setting unit 12b sets beforehand a move regulated area to the crosstalk noise influencing area around a network at which a crosstalk noise exceeds a predetermined level as a constant value.

The move regulated area setting unit 12b can set as a move regulated area an area where the crosstalk noise is not reduced, by correcting a crosstalk noise providing net by means of the wiring pattern correcting unit 12a.

The display 11, as shown in FIG. 3, includes functionally a noise occurring spot displaying unit 11a and a move regulated area displaying unit 11b.

As described above, the noise occurring spot displaying unit 11a links the analytical solution of the transmission path analytic simulator 16 with a wiring pattern edited by the wiring edit and display controlling unit 12 and then displays the outcome as noise-occurring-spot specifying information.

Figure 10:
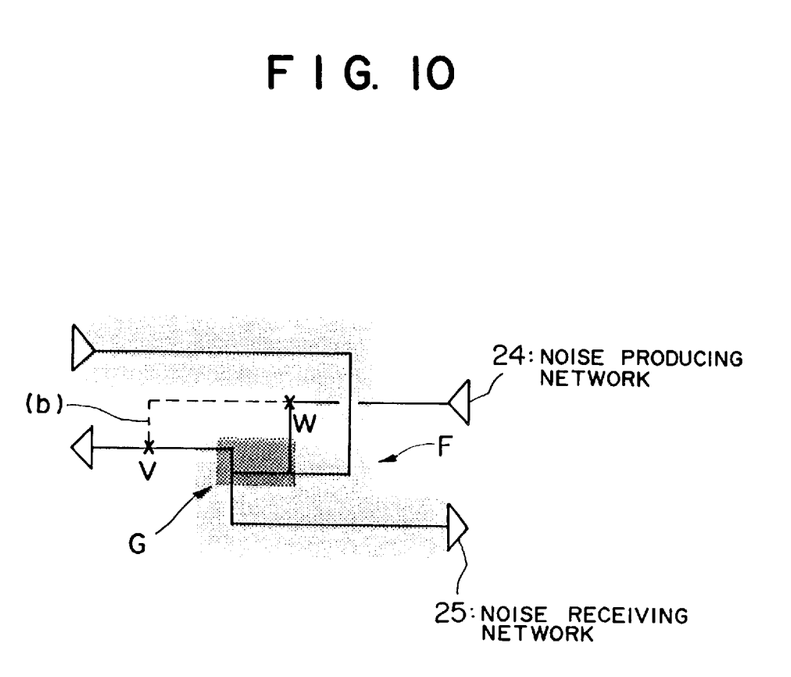
FIG. 10 is a diagram showing an example of a move regulated area displayed on the move regulated area displaying unit of a CAD device according to the present embodiment.

Further, the move regulated area displaying unit 11b displays the move regulated area set by the move regulated area setting unit 12b as the region F, for example, shown in FIG. 10.

In the case shown in FIG. 10, the network 24 provides a crosstalk noise to the network 25. The noise occurring spot is the region G. When the network 24 is corrected by moving and deleting the line on the region G by means of the wiring pattern correcting unit 12a, the line to be moved to the destination is inhibited from extending the move regulated region F.

In this case, the crosstalk noise provided to the network 25 can be maintained to the value before correction by moving the line VW in the crosstalk noise causing region G, for example, as shown with dotted lines (b) in FIG. 10.

As shown in FIG. 10, the move regulated region F in which the line is regulated from moving can be displayed together with the region G as noise-occurring-spot specifying information.

Figure 11:
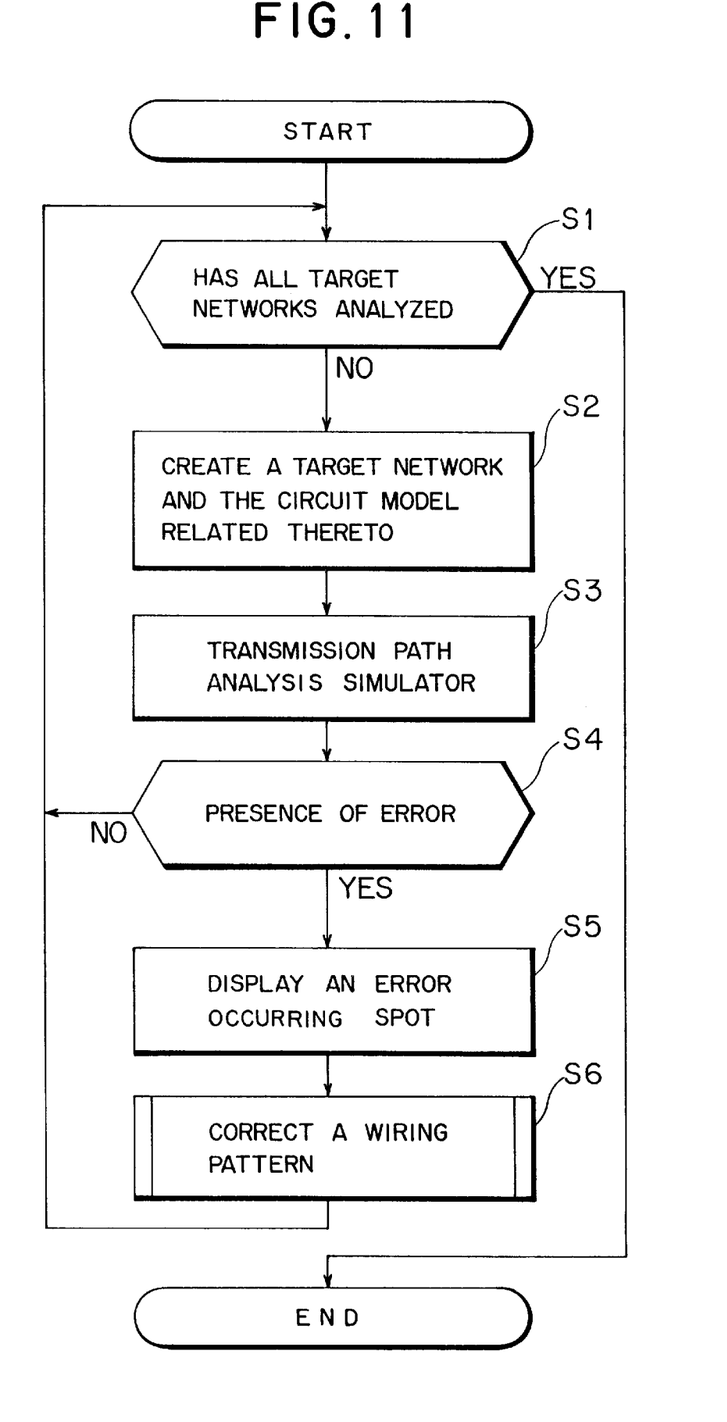
FIG. 11 is a flowchart used for explaining the operation of a CAD device according to the present embodiment.

The operation of the CAD device with the above-mentioned configuration according to the present embodiment will be described below by referring to the flowchart (steps S1 to S6 and steps T1 to T6) shown in FIGS. 11 to 12.

That is, when the wiring edit and display controlling unit 12 edits the wiring pattern to deal with the wiring problem, the display information regarding the wiring pattern is stored in the wiring pattern DB 13.

The circuit model creating unit 14 receives the display information regarding the above-mentioned wiring pattern from the wiring pattern DB 13a and focuses attention on the network acting as a local wiring pattern forming the wiring pattern, thus creating a network of interest and the circuit model of a network related to the network (from step S1 to step S2 via NO route).

The transmission path analytic simulator 16 receives the circuit model created by the circuit model creating unit 14 from the circuit model DB 15 and then executes an analyzing process based on the circuit model, thus returning the analytical solution to the wiring editing and display controlling unit 12 via the analytical solution DB 17 (step S3).

When errors occur due to the analytical solution from the analytical solution DB 17 or the noise peak of the crosstalk noise exceeds a predetermined threshold, the wiring edit and display controlling unit 12 displays controllably by linking the analytical solution from the analytical solution DB 17 on the display 11, together with the crosstalk noise causing spot (from step S4 to step S5 via YES route).

That is, the crosstalk noise causing spot on a wiring pattern as well as the noise peak spot of the analytical solution are displayed and specified on the display 11 using the same symbols. As a result, an operator can clearly judge the spot where a wiring pattern is corrected.

Thereafter, the wiring pattern correcting unit 12a corrects automatically (rewires) the crosstalk noise causing spot to eliminate the error occurred in the step S4 (step S6).

When there is no error based on the analytical solution from the analytical solution DB 17, that is, the noise peak of the crosstalk noise does not exceed a predetermined threshold, or the rewiring in the step S16 has completed, based on the process step similar to the above-described step, a rewiring process is performed based on the crosstalk noise analytical solution over networks interested as all local wiring patterns forming a wiring pattern (step S6 or S4 to step S1 via NO route).

Figure 12:
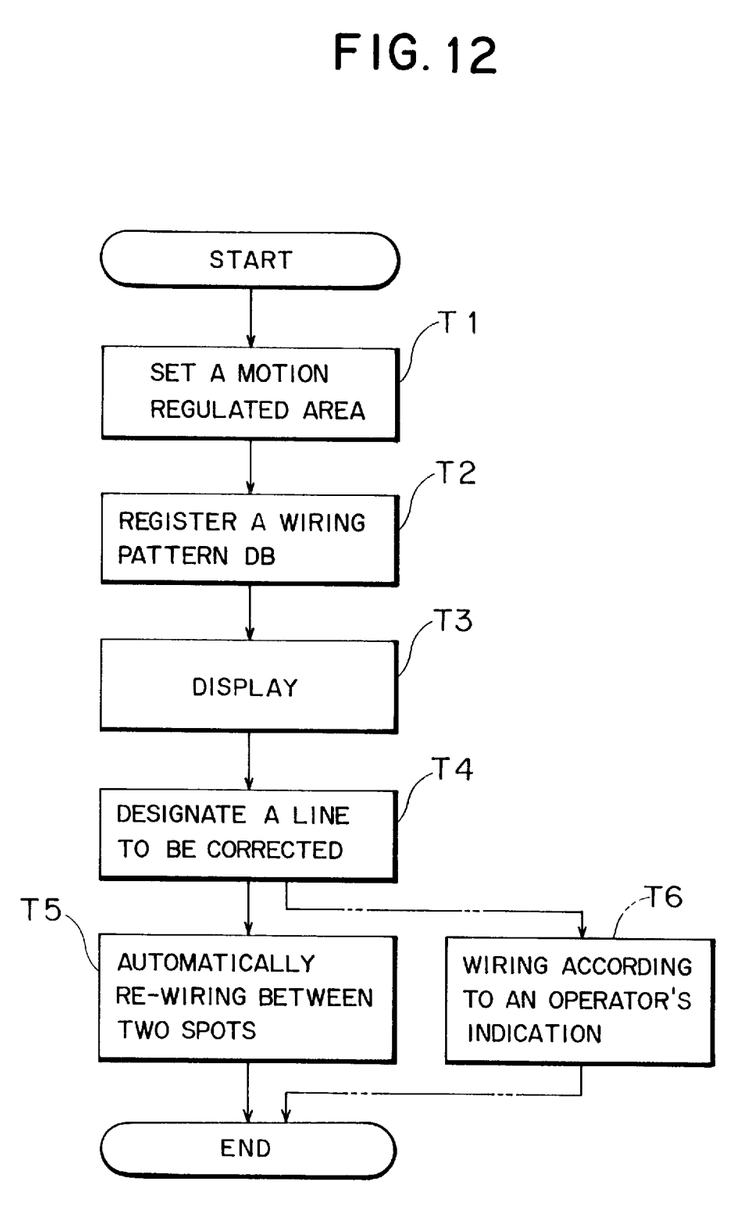
FIG. 12 is a flowchart used for explaining the operation of a CAD device according to the present embodiment.

The wiring pattern correcting unit 12a corrects the crosstalk noise causing spot according to the flowchart shown in FIG. 12.

The move regulated area setting unit 12b sets previously an error causing area as a move regulated region (wiring inhibited region) every line (network) and then sets the wiring pattern correcting unit 12a to inhibit the line from entering the area after the line moving operation (step T1 in the flowchart in FIG. 12).

That is, lines are regulated from moving to the area where a noise occurred in a wiring pattern exceeds a predetermined value is regulated when the circuit is in an active state. This regulation guarantees that the crosstalk noise are reduced certainly after the correcting operation.

After being registered to the wiring pattern DB13 (step T2), the wiring inhibited area set by the move regulated area setting unit 12b can be displayed on the display 11, together with noise-occurring-spot specifying information (step T3).

Thereafter, plural networks causing crosstalk noise exist in an interested local wiring pattern, an operator designates a network to be corrected (step T4). Successively, the wiring pattern correcting unit 12a wires again a designated network automatically or in accordance with an operator's indication (step T5 and T6).

Since the crosstalk noise influences mutually plural lines arranged closely, the network providing crosstalk noise receives necessarily crosstalk noise from other networks.

The transmission path analytic simulator 16 performs an noise analysis by previously setting a crosstalk noise providing network and a crosstalk noise receiving network. However, the analytic simulator 16 also can correct the crosstalk receiving network based on the analytical solution. That is, the process in the step T4 precedes the process in the step T1. Then after the designation of a network to be corrected, the move regulated area setting unit 12b sets the move regulated area for the network to be corrected.

As described above, according to the CAD device of the present embodiment, the wiring edit and display controlling unit 12 and the display 11 can specify (display) a noise occurring spot in a wiring pattern by interlocking the analysis of a crosstalk noise with the automatic wiring pattern editing function, based on the analytical solution of the transmission path analytic simulator 16 and the wiring pattern edited by the wiring pattern edit and display control unit 12. Hence, the operator can clarify the crosstalk noise occurring spot and the man-hours for pattern correction can be reduced. The present invention contributes advantageously to the system automation.

Further, according to the present invention, the move regulated area setting unit 12b is arranged. The wiring pattern correcting unit 12a can be formed such that the line is inhibited from moving to the area set by the move regulated area setting unit 12b when a wiring pattern is corrected. While a crosstalk noise in a wiring pattern is maintained to a value smaller than that before correction by considering the crosstalk noise at the place where the line is moved in a wiring pattern correcting operation, the wiring pattern can be corrected automatically, at high speed, easily and with no manpower. Hence, there is the advantage in that the time of designing wiring can be greatly reduced.

According to the present invention, the move regulated area displaying unit 11b can display the area set by the move regulated area setting unit 12b. Particularly, a wiring pattern is corrected according to an operator's indication, without being conscious of the move regulated area. Hence, it is avoidable that an operator indicates carelessly to move lines to the move regulated area. There is the advantage in that the effective work can significantly reduce the time for wiring design.

What is claimed is:

1. A wiring device comprising:

a wiring pattern editing unit for editing a wiring pattern;

a noise analyzing unit for analyzing noise occurring when a circuit is in an active state according to said wiring pattern edited by said wiring editing unit; and a noise occurring spot specifying unit for specifying a spot where noise occurs in said wiring pattern, based on a solution analyzed by said noise analyzing unit and said wiring pattern edited in said wiring pattern editing units said noise occurring spot specifying unit including a noise occurring spot displaying unit that links the analytical solution of said noise analyzing unit with said wiring pattern edited by said wiring pattern editing unit and then displays the linked result as noise occurring spot specifying information.

2. A wiring method, wherein wiring patterns are edited by a wiring pattern editing unit, comprising the steps of:

analyzing by a noise analyzing unit, a noise occurring when a circuit is operated according to said edited wiring pattern;

linking, by a noise occurring spot specifying unit, an analytical solution obtained in said step of analyzing and said edited wiring pattern; and displaying, by the noise occurring spot specifying unit, a noise occurring spot specifying information in said wiring pattern based on a result of said step of linking.

3. The wiring method according to claim 2, wherein said noise is a crosstalk noise which occurs due to by closely arranged plural lines forming said wiring pattern.

4. The wiring method according to claim 2, further comprising the step of:

correcting said wiring pattern by moving and deleting said lines forming said wiring pattern, based on said noise occurring spot specifying information displayed.

5. The wiring method according to claim 2, further comprising the step of:

regulating said lines moving over an area where a noise occurring in a circuit in an active state exceeds a predetermined value.

6. The wiring method according to claim 5, further comprising the step of:

displaying an area where motion of said line is regulated, together with said noise occurring spot specifying information.

7. A wiring device comprising:

a wiring pattern editing unit for editing a wiring pattern;

a noise analyzing unit for analyzing noise occurring when a circuit is in an active state according to said wiring pattern edited by said wiring editing unit; and a noise occurring spot for identifying unit for specifying a spot where noise occurs in said wiring pattern, based on linking an analytical solution analyzed by said noise analyzing unit with said wiring pattern edited in said wiring pattern editing unit.

8. The wiring device according to claim 7, wherein said noise occurring spot specifying unit comprises a noise occurring spot displaying unit that links the analytical solution of said noise analyzing unit with said wiring pattern edited by said wiring pattern editing unit then displays the linked result as noise occurring spot specifying information.

9. The wiring device according to claim 8, wherein said wiring pattern editing unit comprises a wiring pattern correcting unit that corrects said wiring pattern by moving and deleting lines forming said wiring pattern, based on said noise occurring spot specifying information displayed on said noise occurring spot displaying unit.

10. The wiring device according to claim 9, wherein said wiring pattern correcting unit corrects said wiring pattern by moving and deleting specified lines.

11. The wiring device according to claim 9, further comprising a move regulated area setting unit that sets a move regulated area regulated as a move destination of said line; and wherein said wiring pattern correcting unit regulates said line moving to an area set in said move regulated area setting unit when said wiring pattern is corrected.

12. The wiring device according to claim 11, further comprising a move regulated area displaying unit that displays an area set by said move regulated area setting unit.

* * * * *